US011495285B2

(12) United States Patent
Fujishiro et al.

(10) Patent No.: US 11,495,285 B2
(45) Date of Patent: *Nov. 8, 2022

(54) APPARATUSES AND METHODS FOR SIGNAL LINE BUFFER TIMING CONTROL

(71) Applicant: MICRON TECHNOLOGY, INC., Boise, ID (US)

(72) Inventors: Keisuke Fujishiro, Sagamihara (JP); Yoshifumi Mochida, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/315,161

(22) Filed: May 7, 2021

(65) Prior Publication Data

US 2021/0264969 A1 Aug. 26, 2021

Related U.S. Application Data

(63) Continuation of application No. 16/777,650, filed on Jan. 30, 2020, now Pat. No. 11,011,221.

(51) Int. Cl.

| | |
|---|---|
| ***G11C 11/4093*** | (2006.01) |
| ***G11C 11/4076*** | (2006.01) |
| ***G11C 11/408*** | (2006.01) |
| ***G11C 11/4094*** | (2006.01) |

(52) U.S. Cl.

CPC ...... *G11C 11/4093* (2013.01); *G11C 11/4076* (2013.01); *G11C 11/4085* (2013.01); *G11C 11/4094* (2013.01)

(58) Field of Classification Search

CPC ........... G11C 11/4093; G11C 11/4076; G11C 11/4085; G11C 11/4094; G11C 7/222; G11C 7/1057; G11C 7/1066; G11C 7/1069; G11C 7/1084; G11C 7/1093; G11C 7/1096; G11C 11/4096; G11C 5/063

USPC .................................................... 365/189.05

See application file for complete search history.

(56) References Cited

U.S. PATENT DOCUMENTS

| | | | | |
|---|---|---|---|---|
| 6,947,304 | B1 | 9/2005 | Yen | |
| 7,692,981 | B2 * | 4/2010 | Kwack | G11C 7/1051 365/194 |
| 9,395,739 | B2 | 7/2016 | Chen et al. | |
| 9,613,594 | B2 * | 4/2017 | Yang | G09G 5/18 |
| 9,886,401 | B2 * | 2/2018 | Neeb | G06F 13/1673 |
| 10,490,281 | B2 | 11/2019 | Park et al. | |

(Continued)

*Primary Examiner* — Fernando Hidalgo

(74) *Attorney, Agent, or Firm* — Dorsey & Whitney LLP

(57) ABSTRACT

Apparatuses and methods for signal line buffer timing control are disclosed. An example apparatus includes a plurality of signal lines including first and second control lines and further including data lines, and further includes first and second signal line buffers. The first signal line buffer includes first driver circuits configured to drive respective data signals on the data lines and to drive first and second control signals on the first and second control lines, respectively. The second signal line buffer includes second driver circuits configured to be activated to receive the data signals. The first and second control signals arrive at the second signal line buffer at different times. The second driver circuits are activated responsive a later one of active first and second control signals and are deactivated responsive to an earlier one of inactive first and second control signals.

20 Claims, 7 Drawing Sheets

(56) References Cited

U.S. PATENT DOCUMENTS

| | | | | |
|---|---|---|---|---|
| 2009/0189885 | A1 | 7/2009 | Yeo | |
| 2012/0105124 | A1* | 5/2012 | Park | G11C 7/222 327/276 |
| 2014/0112045 | A1* | 4/2014 | Arsovski | G11C 7/222 365/194 |
| 2018/0005697 | A1* | 1/2018 | Park | G11C 11/4093 |
| 2019/0196533 | A1 | 6/2019 | Kim et al. | |

* cited by examiner

APPARATUSES AND METHODS FOR SIGNAL LINE BUFFER TIMING CONTROL

CROSS-REFERENCE TO RELATED APPLICATION

This application is a continuation of U.S. patent application Ser. No. 16/777,650, filed Jan. 30, 2020. This application is incorporated by reference herein in its entirety and for all purposes.

BACKGROUND

Electronic memories are used in many electronic systems to store information, for example, in electronic systems such as a mobile phone, a tablet, a computer, a server, as well as electronic systems including a processor or having a need to store information. The memory may be controlled through memory commands, such as write commands and read commands, which are received by the memory over a command bus. The information to be stored may be written to a memory cell array of the memory using write commands, and retrieved at a later time by reading the information from the memory cell array of the memory using read commands.

Information may be provided to and from the memory cell array via multiple signal lines that extend throughout the array. The signal lines may be coupled to buffer circuits that drive the signals (e.g., data signals) over the signal lines. In order to maintain the integrity of data being written to or read from the memory cell array, activation and deactivation of the buffer circuits should be controlled accurately to avoid inadvertently driving unstable data signals that may be transitioning from one data state to another.

DETAILED DESCRIPTION

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
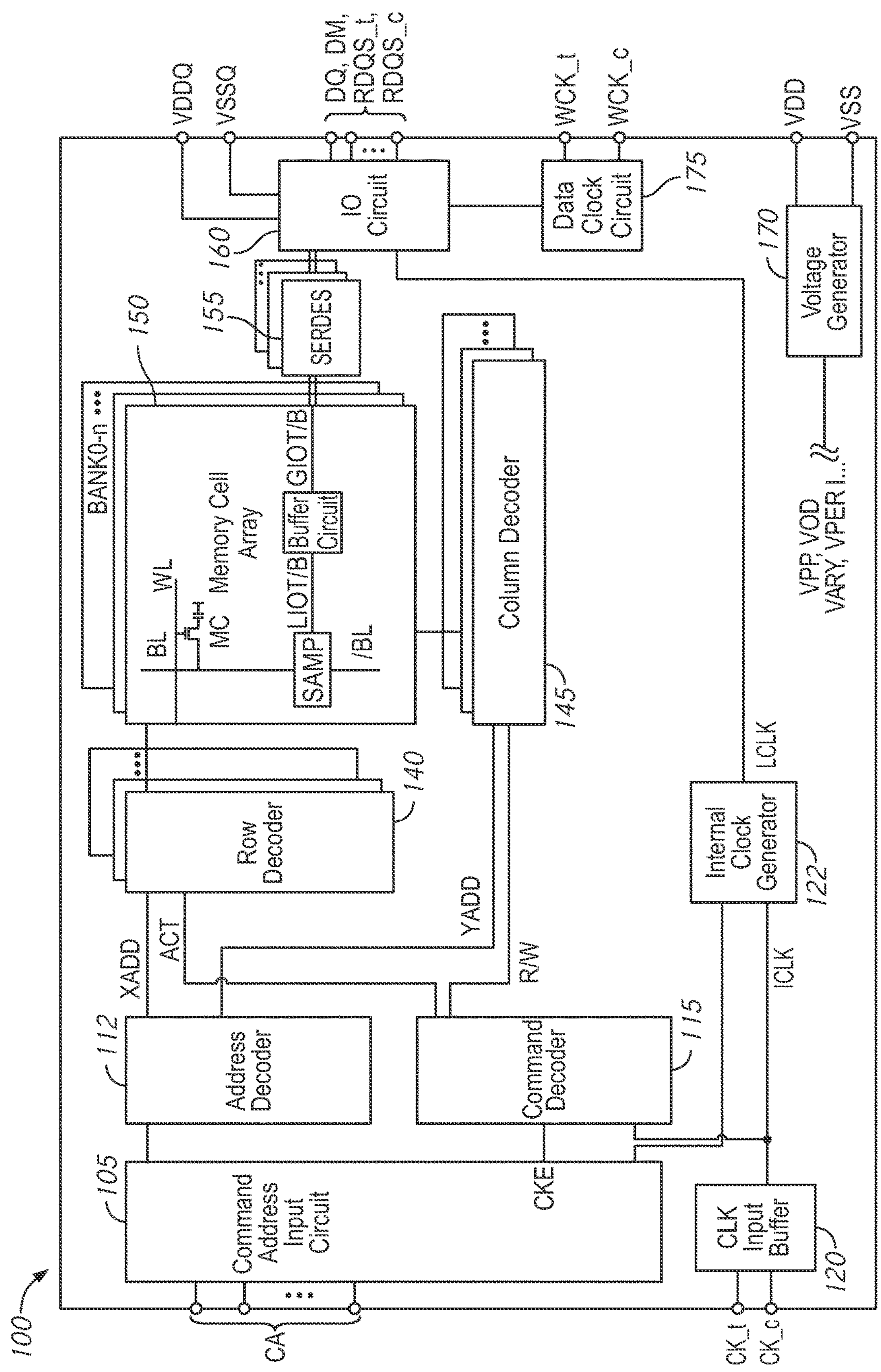
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred to as such. The semiconductor device 100 may include, without limitation, a DRAM device. The semiconductor device 100 may be a low power DDR (LPDDR) memory integrated into a single semiconductor chip in some embodiments of the disclosure.

The semiconductor device 100 includes a memory array 150. The memory array 150 is shown as including a plurality of memory banks. In the embodiment of FIG. 1, the memory array 150 is shown as including n+1 memory banks BANK0-BANKn. Each memory bank includes a plurality of word lines WL, a plurality of bit lines BL and /BL, and a plurality of memory cells MC arranged at intersections of the plurality of word lines WL and the plurality of bit lines BL and /BL. Selection of the word line WL is performed by a row decoder 140 and selection of the bit lines BL and /BL is performed by a column decoder 145. In the embodiment of FIG. 1, the row decoder 140 includes a respective row decoder for each memory bank and the column decoder 145 includes a respective column decoder for each memory bank. The bit lines BL and /BL are coupled to a respective sense amplifier (SAMP). Read data from the bit line BL or /BL is amplified by the sense amplifier SAMP, and transferred to serializer/deserializer (SERDES) 155 over complementary local data lines (LIOT/B), buffer circuit, and complementary global data lines (GIOT/B). Conversely, write data outputted from the serializer/deserializer 155 to the sense amplifier SAMP over the complementary global data lines GIOT/B, the buffer circuit, and the complementary local data lines LIOT/B, and written in the memory cell MC coupled to the bit line BL or /BL.

The SERDES circuitry 155 may support read and write operations by deserializing write data and serializing high speed read data. For example, during a write operation, the SERDES circuitry 155 may be configured to receive serialized write data from the input/output circuit 160 and deserialize the write data (e.g., make it parallel) to provide deserialized write data to memory cell array 150. Additionally, deserialized read data may be received from the memory cell array 150, and the SERDES circuitry 155 may be configured to serialize the read data to provide serialized read data, which may be provided to the input/output circuit 160.

The semiconductor device 100 may employ a plurality of external terminals that include command and address (CA) terminals coupled to a command and address bus to receive commands and addresses. The external terminals may further include clock terminals to receive clocks CK_t and CK_c, and data clocks WCK_t and WCK_c, and to provide access data clocks RDQS_t and RDQS_c, data terminals DQ and DM, and power supply terminals to receive power supply potentials VDD, VSS, VDDQ, and VSSQ.

The clock terminals are supplied with external clocks CK_t and CK_c that are provided to an input buffer 120. The external clocks may be complementary. The input buffer 120 generates an internal clock ICLK based on the CK_t and CK_c clocks. The ICLK clock is provided to a command decoder 115 and to an internal clock generator 122. The internal clock generator 122 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 175, which generates internal data clocks based on the WCK_t and WCK_c clocks. The internal data clocks are provided to an input/output circuit 160 to time operation of circuits included in the input/output circuit 160, for example, to output circuits and/or input receivers to time providing read data and/or the receipt of write data.

The CA terminals may be supplied with memory addresses. The memory addresses supplied to the CA terminals are transferred, via a command/address input circuit 105, to an address decoder 112. The address decoder 112 receives the address and supplies a decoded row address XADD to the row decoder 140 and supplies a decoded column address YADD to the column decoder 145. The CA terminals may also be supplied with commands. Examples of commands include access commands for accessing the memory, such as read commands for performing read operations and write commands for performing write operations, as well as other commands and operations. The commands may be provided as internal command signals to the command decoder 115 via the command/address input circuit 105. The command decoder 115 includes circuits to decode the internal command signals to generate various internal signals and commands for performing operations. For example, the command decoder 115 may provide a row command signal ACT to select a word line and a column command signal R/W to select a bit line.

When an activate command is issued and a row address is timely supplied with the activate command, and a column address is timely supplied with a read command, read data is read from memory cells in the memory array 150 corresponding to the row address and column address. The read command is received by the command decoder 115, which provides internal commands so that read data from the memory array 150 is provided to the serializer/deserializer 155. The read data is output to outside from the data terminals DQ via the input/output circuit 160. The RDQS_t and RDQS_c clocks are provided externally from clock terminals for timing provision of the mad data by the input/output circuit 160. The external terminals DQ include several separate terminals, each providing a bit of data synchronized with a clock edge of the RDQS_t and RDQS_c clocks.

When the activate command is issued and a row address are timely supplied with the activate command, and a column address is timely supplied with a write command, write data supplied to the DQ pads together with the data strobe signal is written to a memory cells in the memory array 150 corresponding to the row address and column address. A data mask may be provided to the data terminals DM to mask portions of the data when written to memory. The write command is received by the command decoder 115, which provides internal commands so that the write data is received by input receivers in the input/output circuit 160. WCK_t and WCK_c clocks are also provided to the external clock terminals for timing the receipt of the write data by the input receivers of the input/output circuit 160. The write data is supplied via the input/output circuit 160 to the serializer/deserializer 155, and to the memory array 150 to be written into the memory cell MC. As previously described, the data terminals DQ include several separate terminals. With reference to a write operation, each data terminal DQ concurrently receives a bit of data synchronized with a clock edge of the WCK_t and WCK_c clocks.

The power supply terminals are supplied with power supply potentials VDD and VSS. The power supply potentials VDD and VSS are supplied to an internal voltage generator circuit 170. The internal voltage generator circuit 170 generates various internal potentials VPP, VOD, VARY, VPERI, and the like based on the power supply potentials VDD and VSS supplied to the power supply terminals. The internal potential VPP is mainly used in the row decoder 140, the internal potentials VOD and VARY are mainly used in the sense amplifiers SAMP included in the memory array 150, and the internal potential VPERI is used in many peripheral circuit blocks.

The power supply terminals are also supplied with power supply potentials VDDQ and VSSQ. The power supply potentials VDDQ and VSSQ are supplied to the input/output circuit 160. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 160 so that power supply noise generated by the input/output circuit 160 does not propagate to the other circuit blocks.

Figure 2:
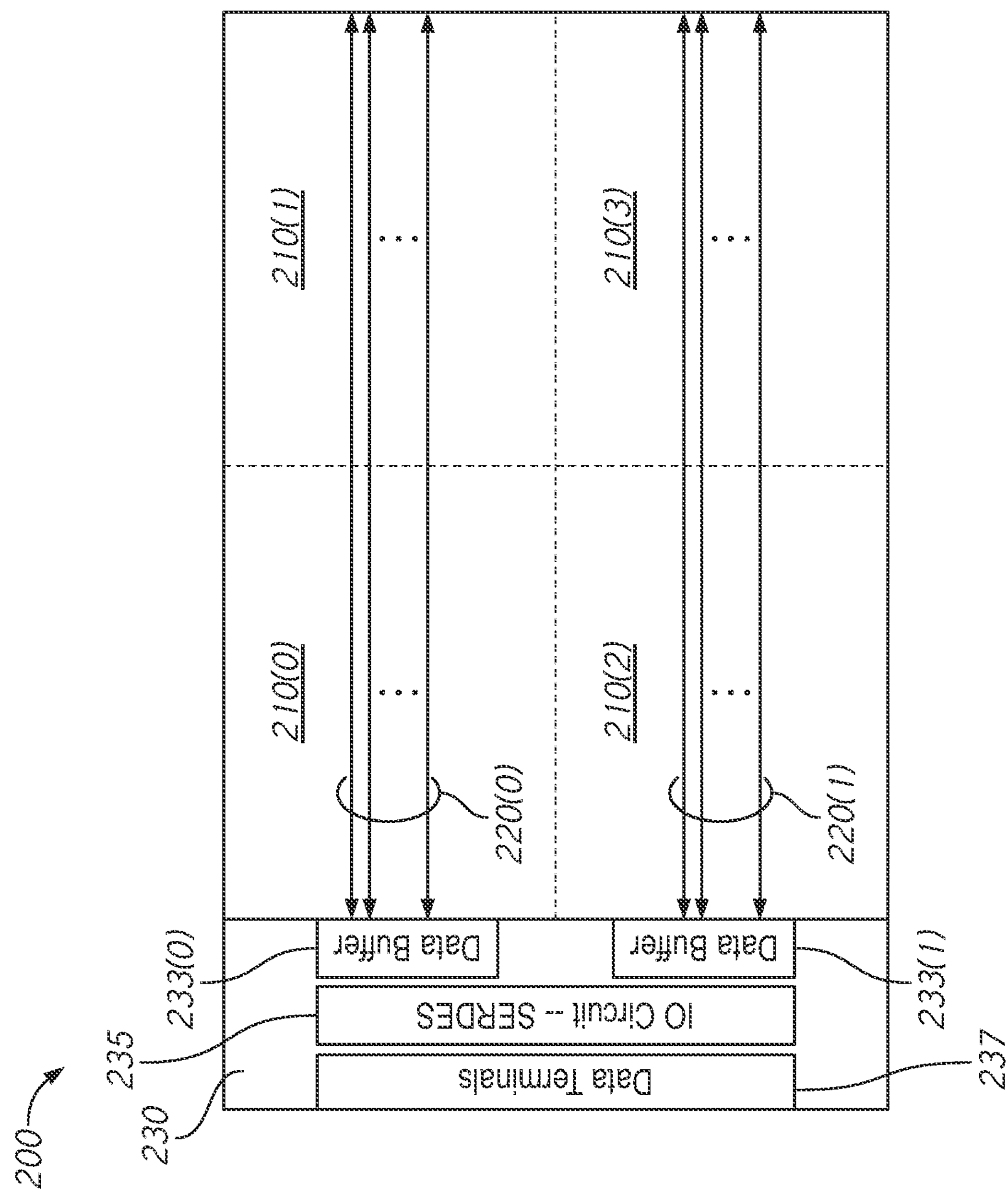
FIG. 2 is a chip layout diagram of a semiconductor device according to an embodiment of the disclosure.

FIG. 2 is a chip layout diagram of a semiconductor device 200 according to an embodiment of the disclosure. In some embodiments, semiconductor device 200 may include at least a portion of semiconductor device 10 shown in FIG. 1.

The semiconductor device 200 includes a memory array region that may be separated into four different array regions 210(0)-210(3). Each of the array regions 210 may include one or more memory banks, and also includes row decoders and column decoders for each memory bank. The semiconductor device 200 further includes a peripheral region 230. Data buffers 233, input/output circuit and serializer/deserializer 235, and data terminals 237 may be included in the peripheral region 230. In some embodiments of the disclosure, the input/output circuit 160 and serializer/deserializer 155, and/or data terminals DQ of the semiconductor device 100 of FIG. 1 may be included in the input/output circuit and serializer/deserializer 235, and/or data terminals 237 of the semiconductor device 200.

An example arrangement of signal lines 220 of the semiconductor device 200 is shown in FIG. 2. The signal lines 220 extend across the army regions 210 and provide data to and from the array regions 210 to data buffers 233. For example, in FIG. 2, the signal lines 220(0) extend across the array regions 210(0) and 210(1) and to the data buffer 233(0) and the signal lines 220(1) extend across the array regions 210(2) and 210(3) and to the data buffer 233(1). For a read operation, data from the array regions 210 are provided on the signal lines 220 to the data buffers 233. The data is provided from the data buffers 233 to the serializer/deserializer and input/output circuit 235, and then to the data terminals 237 as read data. For a write operation, write data provided to the data terminals is received by the input/output circuit and serializer/deserializer 235 and provided to the data buffers 233. The write data is provided from the data buffers 233 to the array regions 210 on the signal lines 220 to be stored.

In some embodiments of the disclosure, the signal lines 220 represent global data lines. Data may be provided from the array regions 210 over local data lines to the global data lines, and data may be provided to the array regions 210 over the global data lines to the local data lines.

Figure 3:
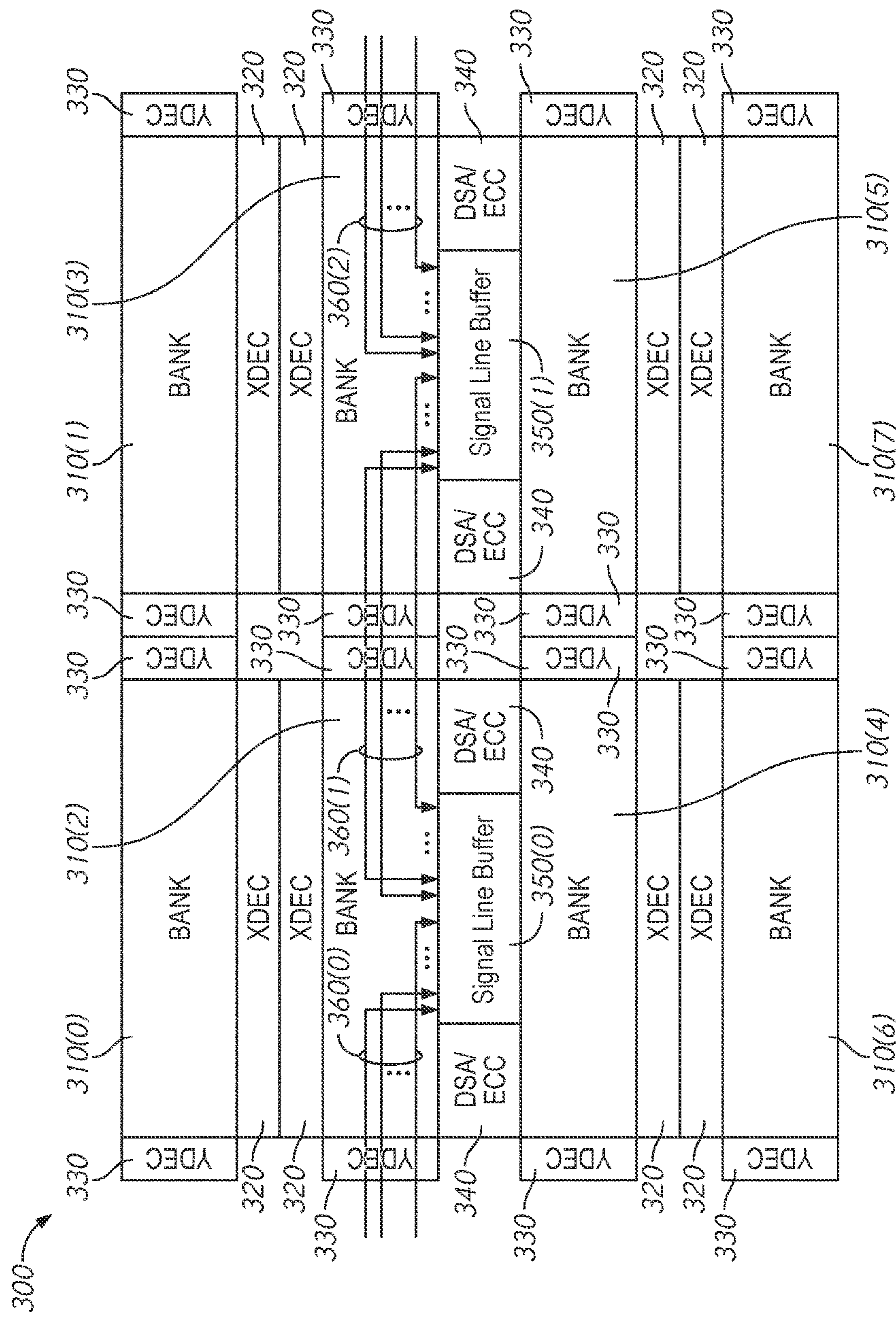
FIG. 3 is a diagram of a layout for an array region according to an embodiment of the disclosure.

FIG. 3 is a diagram of a layout for an array region 300 according to an embodiment of the disclosure. In some embodiments of the disclosure, the array region 300 is included in the semiconductor device 200 of FIG. 2, for example, included in one or more of the array regions 210(0)-210(3).

The array region 300 includes memory banks 310(0)-110(7), and row decoders (XDEC) 320 and column decoders (YDEC) 330. The row decoders 320 and column decoders 330 activate word lines and select bit lines to access memory locations corresponding to memory addresses. The array region 300 further includes data amplifiers and error correction circuits 340 that are shared by the memory banks 310. The data amplifiers amplify data received from or to be provided to the memory banks 310, and the error correction circuits may generate error correction codes and correct the data during the access operation. Signal line buffers 350 are also shared by the memory banks 310 to provide data from the data amplifiers and error correction circuits 340 to signal lines 360 (e.g., read operation), and to receive data from the signal lines 360 to be provided to the data amplifiers and error correction circuits 340 (e.g., write operation).

The signal lines 360 are coupled to the signal line buffers 350, which may receive data from one set of signal lines and provide the data to another set of signal lines. In this manner, data may be provided across the array region 300 through the signal lines 360 and the signal line buffers 350. The signal lines 360 include data lines on which data may be provided. The signal lines 360 further including control lines on which control signals may be provided. The signal line buffers 350 may include driver circuits that drive the data and control signals from one set of signal lines to another set of signal lines through the signal line buffer. The driver circuits may be activated with a timing to accurately provide the data and control signals from one set of signal lines to another set of signal lines. In some embodiments of the disclosure, control signals provided on the control lines of the signal lines 360 may be used to control the timing of activating the driver circuits accordingly.

Figure 4:
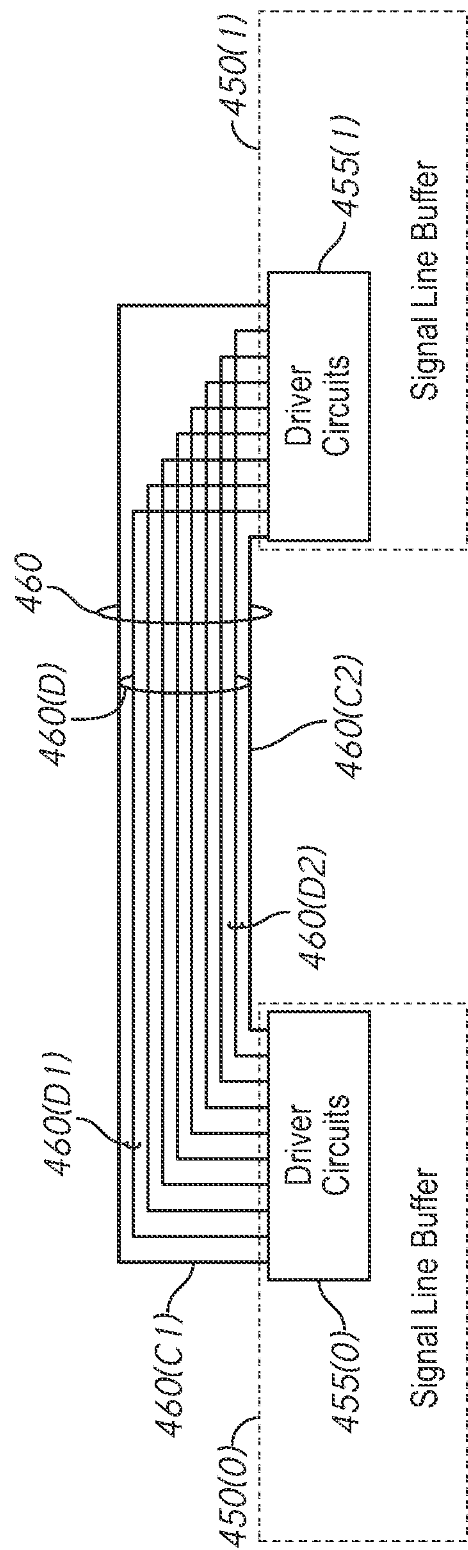
FIG. 4 is a diagram of signal line buffers and signal lines according to an embodiment of the disclosure.

FIG. 4 is a diagram of signal line buffers 450 and signal lines 460 according to an embodiment of the disclosure. In some embodiments of the disclosure, the signal line buffers 450 may be included in the signal line buffers 350 and/or the signal lines 460 may be included in the signal lines 360 of FIG. 3.

The signal line buffers 450(0) and 450(1) each include respective driver circuits 455(0) and 455(1), and the signal lines 460 are coupled to the driver circuits 455(0) and 455(1). The signal lines 460 include data lines 460(D) on which data is provided between the signal line buffers 450(0) and 450(1), and further include control lines 460(C1) and 460(C2) on which control lines are provided between the signal line buffers 450(0) and 450(1).

The data lines 460(D) may each have a different propagation delay. As a result, each of the data lines 460(D) may provide respective data having a different delay, with some data lines providing data later or earlier than others. With reference to the data lines 460(D), the data line 460(D1) adds the greatest delay when providing data between the signal line buffers 450(0) and 450(1) and the data line 460(D2) adds the least delay when providing data between the signal line buffers 450(0) and 450(1). In other words, data provided on the data line 460(D1) from one of the signal line buffers 450 to the other one of the signal line buffers 450 arrives the latest of the data lines 460(D), and data provided on the data line 460(D2) from one of the signal line buffers 450 to the other one of the signal line buffers 450 arrives the earliest of the data lines 460(D). Given the difference in the time when data arrives from one signal line buffer to the other, the timing of activating the driver circuits should be controlled to accurately drive the data from one set of data lines to another.

Control lines 460(C1) and 460(C2) each provide a respective control signal that may be used to control the timing of activating the driver circuits of one or more of the signal line buffers 450. The respective control signals are received, for example, at a signal line buffer 450, at different times. For example, in some embodiments of the disclosure, the control lines 460(C1) and 460(C2) have different propagation delays. Consequently, the control lines 460(C1) and 460(C2) each provide the respective control signal having a different delay, for example, one of the control lines provides the respective control signal having greater than delay than the control signal provided on the other control line.

The different propagation delays of the data lines 460(D) and the control lines 460(C1) and 460(C2) may be the result of various reasons. For example, each of the signal lines 460(D), and 460(C1) and 460(C2) may have a respective inherent impedance. As known, a higher impedance generally results in longer propagation delay for a signal line. As a result, a higher impedance signal line provides a signal with greater delay than a lower impedance signal line (conversely, a lower impedance signal line provides a signal with less delay than a higher impedance signal line).

Typically, a length of a signal line is related to impedance, for example, a longer signal line has higher impedance than a shorter signal line. In an embodiment of the disclosure, the data lines 460(D) have different lengths that range from a longest data line (e.g., data line 460(D1)) to a shortest data line (e.g., data line 460(D2)), and the control line 460(C1) is longer than the control line 460(C2).

The longest data line 460(D1) has the highest impedance, and the shortest data line 460(D2) has the lowest impedance. As a result, the data line 460(D1) has a longer propagation delay than the data line 460(D2), and data provided on the data line 460(D1) arrives at a later time than data provided on the data line 460(D2) (conversely, data provided on the data line 460(D2) arrives earlier than data provided on the data line 460(D1)). The control line 460(C1) has a higher impedance than the control line 460(C2). As a result, the control line 460(C1) has a longer propagation delay than the control line 460(C2), and a control signal provided on the control line 460(C1) arrives at a later time than a control signal provided on the control line 460(C2) (conversely, a control signal provided on the control line 460(D2) arrives earlier than a control signal provided on the control line 460(D1)).

In some embodiments of the disclosure, a first one of the control lines has a propagation delay that provides a signal delay no less than the data line 460(D) having the greatest propagation delay and a second one of the control lines has a propagation delay that provides a signal delay no greater than the data line 460(D) having the shortest propagation delay. For example, where it is assumed the data line 460(D1) has the greatest propagation delay of the data lines 460(D) and the data line 460(D2) has the shortest propagation delay of the data liners 460(D), in some embodiments of the disclosure, the control line 460(C1) may have a propagation delay no less than the data line 460(D1) and the control line 460(C2) may have a propagation delay no less than the data line 460(D2).

In some embodiments of the disclosure, a first one of the control lines is at least as long as the longest of the data lines 460(D) and a second one of the control lines is at most as short as the shortest of the data lines 460(D). For example, where it is assumed the data line 460(D1) is the longest data line of the data lines 460(D) and the data line 460(D2) is the shortest data line of the data lines 460(D), in some embodiments of the disclosure, the control line 460(C1) may be at least as long as the data line 460(D1) and the control line 460(C2) may be at most as short as the data line 460(D2).

In some embodiments of the disclosure, a first one of the control lines provides a first control signal at least as slow as the slowest data signal and a second one of the control lines provides a second control signal at least as fast as the fastest data signal. For example, where it is assumed the data line 460(D1) provides the slowest data signal of the data lines 460(D) and the data line 460(D2) provides the fastest data signal of the data liners 460(D), in some embodiments of the disclosure, the control line 460(C1) may provide a first control signal at least as slow as the data line 460(D1) provides a data signal and the control line 460(C2) may provide a second control signal at least as fast as the data line 460(D2) provides a data signal.

One or more of the previous embodiments may be included together in an embodiment of the disclosure. For example, an embodiment of the disclosure may include (1) a first one of the control lines has a propagation delay that provides a signal delay no less than the signal line 460(D) having the greatest propagation delay and a second one of the control lines has a propagation delay that provides a signal delay no greater than the signal line 460(D) having the shortest propagation delay; and/or a first one of the control lines is at least as long as the longest signal line 460(D) and a second one of the control lines is at most as short as the shortest signal line 460(D); and/or a first one of the control lines provides a first control signal at least as slow as the slowest data signal and a second one of the control lines provides a second control signal at least as fast as the fastest data signal.

In operation, data signals are provided by driver circuits of a first signal line buffer on data lines 460(D) and first and second control signals are provided by the first signal line buffer on respective control lines 460(C1) and 460(C2). Driver circuits of a second signal line buffer receive the data and control signals are activated based on the first and second control signals, which arrive at the second signal line buffer at different times.

Figure 5:
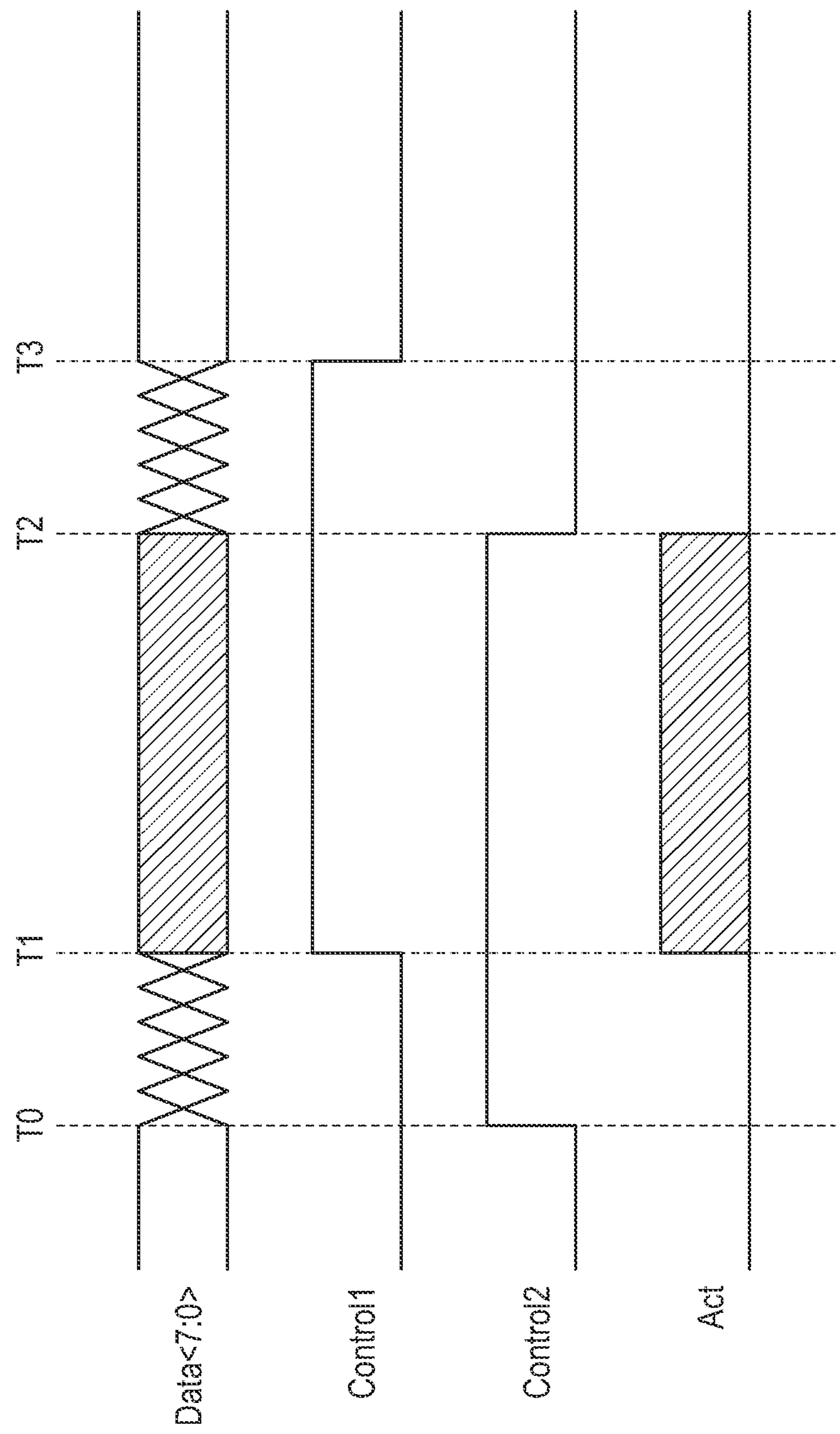
FIG. 5 is a timing diagram of various signals during operation of driver circuits of a signal line buffer according to an embodiment of the disclosure.

FIG. 5 is a timing diagram of various signals during operation of driver circuits of a signal line buffer according to an embodiment of the disclosure. In some embodiments of the disclosure, the example operation of FIG. 5 is performed by the driver circuits 455 of the signal line buffers 450 of FIG. 4. FIG. 5 will be described with reference to the signal line buffers 450 and the signal lines 460 of FIG. 4. However, operation of the signal line buffers 450 and the signal lines 460 is not limited to the example operation of FIG. 5, and the example operation of FIG. 5 is not limited to the signal line buffers 450 and the signal lines 460.

Prior to time T0, data is provided by a first signal line buffer (e.g., signal line buffer 450(0)) on data lines 460(D) and first and second control signals Control1 and Control2, respectively, are provided by the first signal line buffer 450(0) on control lines 460(C1) and 460(C2). Generally, it is assumed that active first and second control signals Control1 and Control2 (e.g., active high logic level), and the data are provided at the same time by the first signal line buffer 450(0). In some embodiments of the disclosure, the first and second control signals Control1 and Control2 are active for a same duration.

The active second control signal Control2 is received at time T0 at a second signal line buffer (e.g., signal line buffer 450(1)) and the active first control signal Control1 is received later at time T1. Between times T0 and T1, the data is received at different times by the second signal line buffer 450(1). The timing difference between the control signals Control1 and Control2, and the data signals, may be caused, for example, by the data lines and the first and second control lines having different propagation delays between the first and second signal line buffers 450(0) and 450(1).

At time T1, responsive to receipt of the active first control signal Control1, the driver circuits 455(1) of the second signal line buffer 450(1) are activated to drive data and the control signals Control1 and Control2, for example, on to another set of signal lines. At time T2, an inactive second control signal Control2 is received at the second signal line buffer 450(1), and in response, the driver circuits 455(1) of the second signal line buffer 450(1) are deactivated. At time T3, an inactive first control signal Control1 is received by the second signal line buffer 450(1). The driver circuits 455(1) of the second signal line buffer 450(1), however, are already deactivated by the inactive second control signal Control2, as previously described. Between times T2 and T3, the data may be transitioning to different data values and are received at different times due to the different propagation delays of the respective signal lines.

As shown in the example operation of FIG. 5, the timing of activating the driver circuits 455(1) is based on the first and second control signals Control1 and Control2. The driver circuits 455(1) are activated by a later one of the active first and second control signals and deactivated by the earlier one of the active first and second control signals. The driver circuits 455(1) are activated by the control signals Control1 and Control2 with a timing to prevent an early activation and late deactivation. As a result, despite the different arrival times of the data at the second signal line buffer 450(1), the driver circuits 455(1) are activated with a timing that avoids inadvertently driving unstable data.

Figure 6:
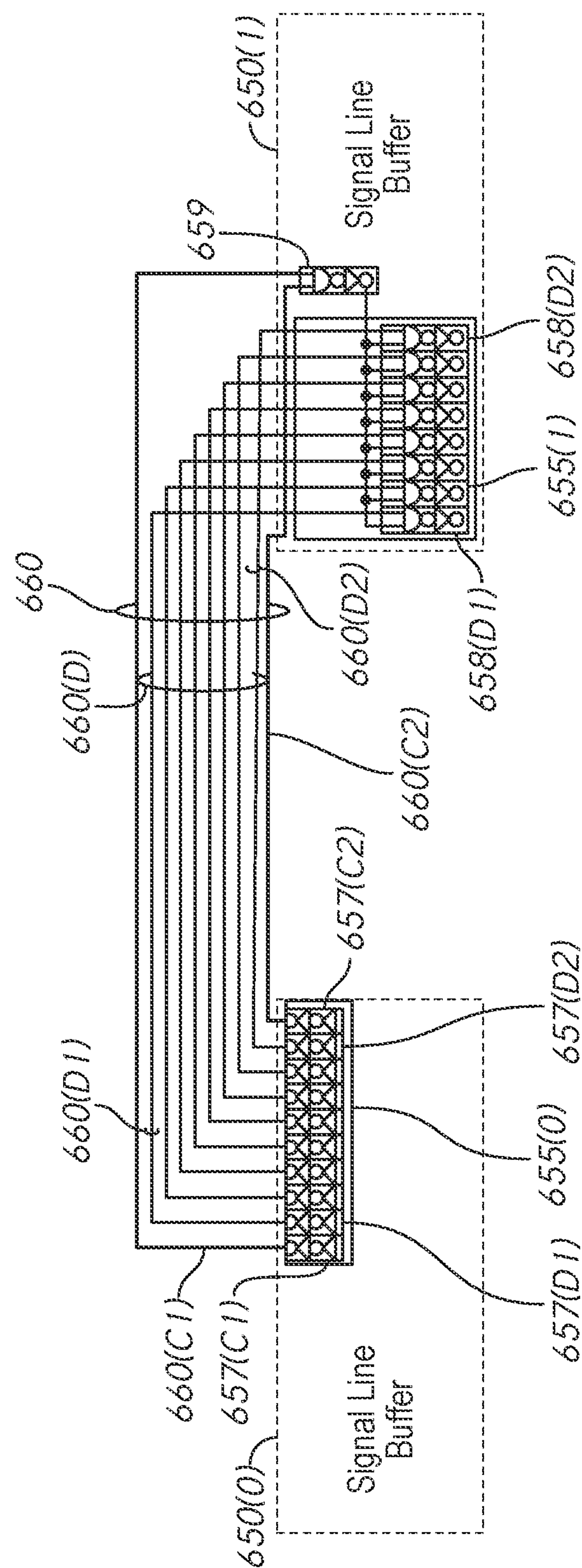
FIG. 6 is a diagram of a signal line buffers and diagram of signal lines according to an embodiment of the disclosure.

FIG. 6 is a diagram of a signal line buffers 650 and diagram of signal lines 660 according to an embodiment of the disclosure. In some embodiments of the disclosure, the signal line buffers 650 may be included in the signal line buffers 350 and/or the signal lines 660 may be included in the data lines 360 of FIG. 3.

The signal line buffers 650(0) and 650(1) each include respective driver circuits 655(0) and 655(1), and the signal lines 660 are coupled to the driver circuits 655(0) and 655(1). The signal lines 660 include data lines 660(D) on which data is provided between the signal line buffers 650(0) and 650(1), and further include control lines 660(C1) and 660(C2) on which control lines are provided between the signal line buffers 650(0) and 650(1). The data lines 660(D) are similar to the data lines 460(D) previously described with reference to FIG. 4, and the previous description of the data lines 460(D) may apply to the data lines 660(D) as well.

The driver circuits 655(0) of signal line buffer 650(0) include signal drivers 657. A respective signal driver 657 is included for each of the data signals and the control signals. For example, signal driver 657(C1) drives a first control signal on the control line 660(C1) and signal driver 657(C2) drives a second control signal on the control line 460(C2); and signal drivers 657(D1) through 657(D2) drive data on respective data lines 660(D1) through 660(D2). In the example of FIG. 6, the signal drivers 657 include series coupled inverter circuits. However, in other embodiments of the disclosure, other circuits may be alternatively or additionally included in the signal drivers 657.

The driver circuits 655(1) of signal line buffer 650(1) include signal drivers 658. A respective signal driver 658 is included for each of the data signals. For example, signal drivers 658(D1) through 658(D2) receive data on respective data lines 660(D1) through 660(D2) and drive data, for example, from the data lines 660(D) to another set of data lines, when activated. In the example of FIG. 6, the signal drivers 658 include series coupled NAND logic gate and inverter circuit. Data from a respective data line 660(D) is provided to a first input of the NAND logic gate. In other embodiments of the disclosure, other circuits may be alternatively or additionally included in the signal drivers 658.

The signal line buffer 650(1) further includes driver control logic 659 that is provided first and second control signals from the control lines 660(C1) and 660(C2), and provides a driver activation signal to the signal drivers 658 that is based on the first and second control signals. For example, the driver activation signal is provided to a second input of the NAND logic gates of the signal drivers 658. When the driver activation signal is active, the signal drivers 658 are activated and drive data provided on a respective data line 660(D). In the example of FIG. 6, the driver control logic 659 includes series coupled NAND logic gate and inverter circuit. However, in other embodiments of the disclosure, other circuits may be alternatively or additionally included in the driver control logic 659.

In operation, the signal drivers 657 of the driver circuit 655(0) drive a respective signal onto a respective one of the data lines 660(D). As previously described, the signal drivers 657(C1) and 657(C2) provide first and second control signals, respectively, and the signal drivers 657(D1) through 657(D2) provide respective data signals. The signals provided by the signal drivers 657 generally have the same timing. However, due to the different propagation delays of the different data lines, the respective data signals arrive at different times at the signal drivers 658 of the driver circuit 655(1). The signal drivers 658 drive a respective data signal when activated by an active driver activation signal provided by the driver control logic 659.

In some embodiments of the disclosure, the propagation delay of the control line 660(C1) may be the same or greater than a propagation delay of the data line having the longest propagation delay of the data lines (e.g., data line 660(D1)), and the propagation delay of the control line 660(C2) may be the same or less than a propagation delay of the data line having the shortest propagation delay of the data lines (e.g., data line 660(D2)). In some embodiments of the disclosure, the data line having the highest signal path impedance has the longest propagation delay and the data line having the lowest signal path impedance has the shortest propagation delay.

The first and second control signals arrive at different times at the driver control logic 659. For example, even if first and second control signals become active at the same time at the signal drivers 657(C1) and 657(C2), the active second control signal provided on the control line 660(C2) arrives at the driver control logic 659 before the active first control signal provided on the control line 660(C1)(conversely, the active first control signal arrives at the driver control logic 659 later than the active second control signal). In some embodiments of the disclosure, the first and second control signals arrive at different times at the driver control logic 659 because the control line 660(C1) has a propagation delay greater than the propagation delay of the control line 660(C2). Although the active second control line arrives at the driver control logic 659, the driver activation signal remains inactive. As a result, the signal drivers 658 remain deactivated. When the active first control signal arrives, the driver control logic 659 provides an active driver activation signal. As a result, the signal drivers 658 are activated and each drive a respective data signal (e.g., to another set of data lines 660).

The driver control logic 659 continues to provide an active driver activation signal until either the first or second control signal becomes inactive. In an embodiment of the disclosure with the control line 660(C2) having a lower propagation delay than the control line 660(C1), even if the first and second control signals become inactive at the same time at the signal drivers 657(C1) and 657(C2), the inactive second control signal will arrive at the driver control logic 659 before the inactive first control signal. When the inactive second control signal arrives at the driver control logic 659, the driver activation signal becomes inactive. As a result, the signal drivers 658 are deactivated, and the data signals are no longer driven by the respective signal drivers 658.

As shown in the example operation of FIG. 6, the timing of activating the signal drivers 658 is based on the first and second control signals. The signal drivers 658 are activated by a later one of the active first and second control signals and deactivated by the earlier one of the active first and second control signals. The signal drivers are activated by the first and second control signals with a timing to prevent an early activation and late deactivation. As a result, despite the different arrival times of the data at the signal drivers 658 of driver circuits 655(1), the signal drivers 658 are activated with a timing that avoids inadvertently driving unstable data.

Figure 7:
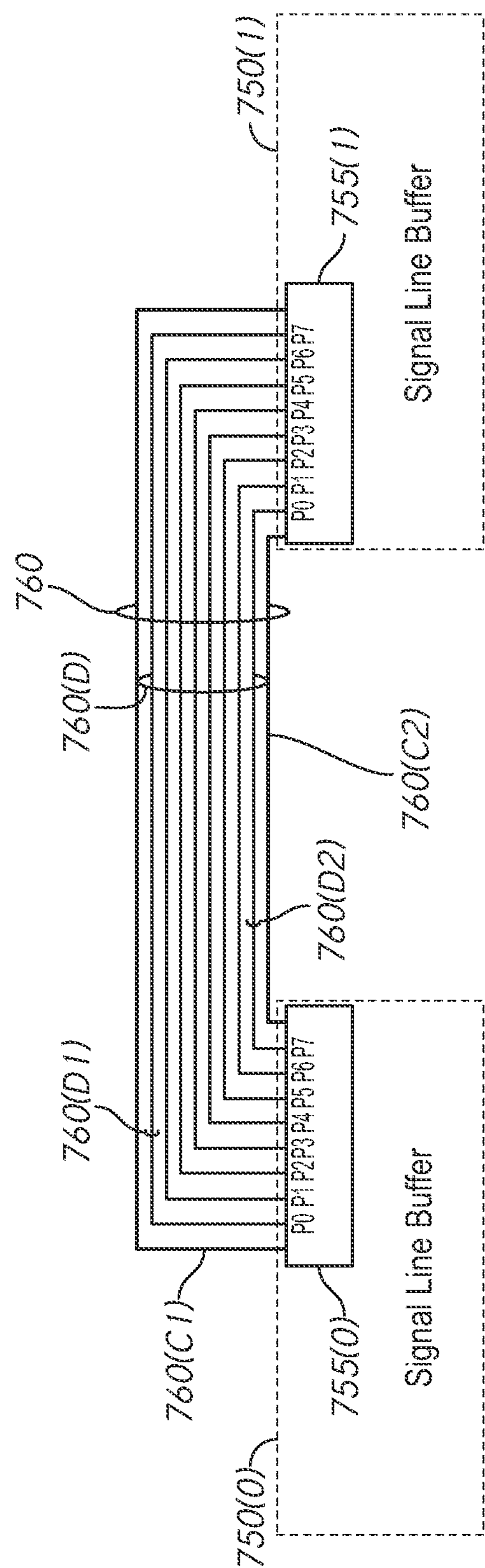
FIG. 7 is a diagram of signal line buffers and signal lines according to an embodiment of the disclosure.

FIG. 7 is a diagram of signal line buffers 750 and signal lines 760 according to an embodiment of the disclosure. In some embodiments of the disclosure, the signal line buffers 750 may be included in the signal line buffers 350 and/or the signal lines 760 may be included in the signal lines 360 of FIG. 3.

The signal line buffers 750(0) and 750(1) each include respective driver circuits 755(0) and 755(1), and the signal lines 760 are coupled to the driver circuits 755(0) and 755(1). The signal lines 760 include data lines 760(D) on which data is provided between the signal line buffers 750(0) and 750(1), and further include control lines 760(C1) and 760(C2) on which control lines are provided between the signal line buffers 750(0) and 750(1).

The driver circuits 755(0) and 755(1) may be similar to the driver circuits 455(0) and 455(1) of the example of FIG. 4, and the previous description of the driver circuits 455(0) and 455(1) may apply to the driver circuits 755(0) and 755(*l*). In some embodiments of the disclosure, the driver circuits 755(0) include the driver circuits 655(0) and the driver circuits 755(1) include the driver circuits 655(1) of FIG. 6.

The data lines 760(D) are similar to the data lines 460(D) previously described with reference to FIG. 4, and the previous description of the data lines 460(D) may apply to the data lines 760(D) as well. However, in contrast to the data lines 460(D), the data lines 760(D) are coupled to the driver circuits 655(1) differently than the data lines 460(D) are coupled to the driver circuits 455(1). For example, the data line 760(D1) is coupled to the driver circuits 755(0) at position P0 (same position as data line 460(D1) is coupled to the driver circuits 455(0)), but the data line 760(D1) is coupled to the driver circuits 755(1) at position P7 (different position than data line 460(D1) is coupled to the driver circuits 455(1)). The data line 460(D1) is coupled to the driver circuits 455(1) at position P0 whereas the data line 760(D1) is coupled to the driver circuits 755(1) at position P7. Additionally, the data line 760(D2) is coupled to the driver circuits 755(0) at position P7 (same position as data line 460(D2) is coupled to the driver circuits 455(0)), but the data line 760(D2) is coupled to the driver circuits 755(1) at position P0 (different position than data line 460(D2) is coupled to the driver circuits 455(1)). The data line 460(D2) is coupled to the driver circuits 455(1) at position P7 whereas the data line 760(D2) is coupled to the driver circuits 755(1) at position P0. The data lines between data lines 760(D1) and 760(D2) are also coupled to the driver circuits 755(1) differently than the data lines between data lines 460(D1) and 460(D2) are coupled to the driver circuits 455(1).

The control lines 760(C1) and 760(C2) have different propagation delays. In some embodiments of the disclosure, one of the control lines has a propagation delay that is the same or greater than a propagation delay of the data line having the longest propagation delay, and another one of the control lines has a propagation delay that is the same or less than a propagation delay of the data line having the shortest propagation delay. In some embodiments of the disclosure, the control line 760(C1) is physically longer than the control line 760(C2). In some embodiments of the disclosure, the control line 760(C1) is the same length or longer than the data line having the longest length, and the control line 760(C2) is the same length or shorter than the data line having the shortest length.

With reference to the example of FIG. 4, each of the data lines 460(D) couple to a first driver circuit 455(0) and couple to a second driver circuit 455(1) at corresponding positions (e.g., P0-P0, P1-P1, P2-P2 . . . P7-P7). However, with reference to the example of FIG. 7, each of the data lines 760(D) couple to a first driver circuit 755(0) and couple to a second driver circuit 755(1) at non-corresponding positions. For example, in some embodiments of the disclosure, the data lines 760(D) couple to a first driver circuit 755(0) and couple to a second driver circuit 755(1) in reverse positions (e.g., P0-P7, P1-P6, P2-P5 . . . P7-P0).

The arrangement of data lines and the coupling position with respect to the driver circuits as described with reference to FIGS. 4-6 provide different layout options for the circuits and signal lines to accommodate different layouts and designs for an integrated circuit (e.g., memory device). For example, one of the arrangements previously described may be better suited for a design that uses two or more conductive layers and/or conductive vias, whereas another one of the arrangements may be better suited for a design that uses one conductive layer.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:

a plurality of data lines each configured to provide a respective data signal;

first and second control lines configured to provide first and second control signals, respectively;

first driver circuits coupled to the plurality of data lines and the first and second control lines, the first driver circuits configured drive a respective data signal or a respective control signal; and second driver circuits coupled to the plurality of data lines and the first and second control lines, the second driver circuits activated to receive the respective data signals based on the first and second control signals, wherein the first control line is configured to have a propagation delay as long or longer than a first data line of the plurality of data lines having a longest propagation delay of the plurality of data lines, and wherein the second control line is configured to have a propagation delay as short or shorter than a second data line of the plurality of data lines having a shortest propagation delay of the plurality of data lines.

2. The apparatus of claim 1 wherein the first control line provides the first control signal having a different delay than the second control signal provided by the second control line.

3. The apparatus of claim 1 wherein the first data line provides data having a different delay than data provided by the second data line.

4. The apparatus of claim 1 wherein the first control line has a different length than the second control line.

5. The apparatus of claim 1 wherein the first control line has a length that is equal to or greater than a length of the first data line and the second control line has a length that is equal to or shorter than a length of the second data line.

6. The apparatus of claim 1 wherein the second driver circuits are configured to be activated responsive to a later one of active first and second control signals and to be deactivated responsive to an earlier one of inactive first and second control signals.

7. The apparatus of claim 6, further comprising driver control logic configured to receive the first and second control signal and provide a driver activation signal to the second driver circuits, the driver logic further configured to provide an active driver activation signal to activate the second driver circuit with a timing based on the timing of active and inactive first and second control signals.

8. An apparatus, comprising:

a plurality of data lines each configured to provide a respective data signal;

first and second control lines configured to provide first and second control signals, respectively;

first driver circuits coupled to the plurality of data lines and the first and second control lines, the first driver circuits configured drive a respective data signal or a respective control signal; and second driver circuits coupled to the plurality of data lines and the first and second control lines, the second driver circuits activated to receive the respective data signals based on the first and second control signals, wherein the first control line is configured to have an impedance that is greater than an impedance of a first data line of the plurality of data lines having a greatest impedance, and wherein the second control line is configured to have an impedance that is less than an impedance of a second data line of the plurality of data lines having a lowest impedance.

9. The apparatus of claim 8 wherein the first control line is configured to have a longer propagation delay than the second control line, and to have a propagation delay.

10. The apparatus of claim 8 wherein the first control line is configured to have a length greater than the second control line.

11. The apparatus of claim 8 wherein the first control line is configured to provide the first control signal having a delay greater than a delay for the second control signal provided by the second control line.

12. The apparatus of claim 8 wherein the first control line is configured to provide the first control signal having a delay no less than a delay for data provided by the first data line.

13. The apparatus of claim 8 wherein the first control line is configured to provide the second control signal having a delay no greater than a delay for data provided by the second data line.

14. The apparatus of claim 8, further comprising driver control logic coupled to the first and second control lines and configured to activate the second driver circuits responsive to a later one of active first and second control signals and deactivate the second driver circuits responsive to an earlier one of inactive first and second control signals.

15. A method, comprising:

driving first and second control signals over respective control lines concurrently;

driving a plurality of data signals each over a respective one of a plurality of data lines concurrently; and receiving at driver circuits an active first control signal no earlier than an arrival of a first data signal of the plurality of data signals provided on a first data line of the plurality of data lines and receiving an active second control signal no later than an arrival of second data of the plurality of data signals provided on a second data line of the plurality of data lines, wherein the driver circuits are configured to be activated to receive the first and second data with a timing based on a timing of the active first and second control signals.

16. The method of claim 15 wherein the driver circuits are configured to be deactivated to not receive the plurality of data signals responsive to an earlier one of inactive first and second control signals.

17. The method of claim 15 wherein the driver circuits are configured to be activated to receive the plurality of data responsive to a later one of active first and second control signals.

18. The method of claim 15, further comprising providing the first and second control signals, and the plurality of data signals concurrently from other driver circuits.

19. The method of claim 18 wherein providing the first control signal comprises providing the first control signal on a first respective control line and providing a first data signal of the plurality of data signals comprises provided the first data signal on a first data line of the plurality of data lines having a propagation delay less than a propagation delay of the first respective control line.

20. The method of claim 18 wherein providing the first control signal comprises providing the first control signal on a first respective control line and providing a first data signal of the plurality of data signals comprises provided the first data signal on a first data line of the plurality of data lines having a lower impedance than an impedance of the first respective control line.

* * * * *